(12) United States Patent
Hong et al.

(10) Patent No.: US 6,677,232 B2
(45) Date of Patent: Jan. 13, 2004

(54) METHOD FOR FABRICATING METAL CONDUCTORS AND MULTI-LEVEL INTERCONNECTS IN A SEMICONDUCTOR DEVICE

(75) Inventors: Qi-Zhong Hong, Dallas, TX (US); Wei-Yung Hsu, Foster City, CA (US); Vincent T. Cordasco, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/002,092

(22) Filed: Nov. 1, 2001

(65) Prior Publication Data

US 2002/0081837 A1 Jun. 27, 2002

Related U.S. Application Data

(60) Provisional application No. 60/257,898, filed on Dec. 21, 2000.

(51) Int. Cl.⁷ .......................................... H01L 21/4763
(52) U.S. Cl. ....................... 438/627; 438/424; 438/622
(58) Field of Search ................................. 438/424, 430, 438/618, 622, 627

(56) References Cited

U.S. PATENT DOCUMENTS

| | | | | | |
|---|---|---|---|---|---|
| 6,268,291 | B1 | * | 7/2001 | Andricacos et al. | 438/694 |
| 6,326,301 | B1 | * | 12/2001 | Venkatesan et al. | 438/638 |
| 6,352,926 | B1 | * | 3/2002 | Ding et al. | 438/687 |
| 6,372,633 | B1 | * | 4/2002 | Maydan et al. | 438/637 |

* cited by examiner

Primary Examiner—Amir Zarabian
Assistant Examiner—Pamela Perkins
(74) Attorney, Agent, or Firm—Peter K. McLarty; W. James Brady, III; Frederick J. Telecky, Jr.

(57) ABSTRACT

A method for fabricating a metal conductor in a semiconductor device includes forming a trench in a dielectric layer of the semiconductor device. The method also includes depositing a first conducting material within the trench to form a continuous liner layer within the trench. The liner layer is formed at a first predetermined temperature. The method further includes filling a remaining portion of the trench over the liner layer with a second conducting material at a second predetermined temperature. The second predetermined temperature is greater than the first predetermined temperature.

15 Claims, 3 Drawing Sheets

METHOD FOR FABRICATING METAL CONDUCTORS AND MULTI-LEVEL INTERCONNECTS IN A SEMICONDUCTOR DEVICE

This application claims priority under 35 USC §119(e)(1) of provisional application No. 60/257,898 filed Dec. 21, 2000.

TECHNICAL FIELD OF THE INVENTION

This invention relates generally to the fabrication of semiconductor devices and, more particularly, to a method for fabricating metal conductors and multi-level interconnects in a semiconductor device.

BACKGROUND OF THE INVENTION

Trenches or channels and other types of regions are often formed in a dielectric substrate of a semiconductor device to form conductors made of copper, copper alloys or other conducting materials. For example, trench patterns may be etched, or formed using other suitable methods, and subsequently filled with a conducting material. Additionally, because the conducting material may diffuse rapidly into other materials, such as the dielectric material, a diffusion barrier may also be deposited onto the dielectric material and the surfaces of the trench. Similarly, vias may be formed and filled with a conducting material, such as copper, copper alloys, or other suitable conducting materials, to provide a multi-level interconnect between two or more trench patterns.

However, as the width of the trench or via decreases, or as the depth of the trench or via increases, filling the trench or via with the conducting material becomes increasingly difficult. For example, as the conducting material is deposited into the trench or via, an overhang of the conducting material at or near upper portions of the opposing sidewalls of the trench or via may result in premature contact of the conducting material from the opposing sidewalls, thereby resulting in a void or cavity formation within the conducting material. Further, as the aspect ratio, or the depth-to-width ratio, of the trench or via increases, voids or other discontinuities within the conducting material may occur during filling of the trench or via.

Additionally, if the temperature of the conducting material is increased to obtain improved mobility of the conducting material during filling of the trench or via, agglomeration of the conducting material may result along the sidewalls and bottom surface of the trench or via, thereby resulting in discontinuities on the conducting material. Agglomeration of the conducting material may also result during filling of the trench or via as the thickness of a layer of the conducting material decreases.

SUMMARY OF THE INVENTION

Accordingly, a need has arisen for a method for fabricating a metal conductor or multi-level interconnect in a semiconductor device which reduces the likelihood of voids or other discontinuities within the conducting materials. The present invention provides a method for fabricating metal conductors and multi-level interconnects in a semiconductor device that addresses shortcomings of prior semiconductor fabrication methods.

According to one embodiment of the present invention, a method for fabricating a metal conductor in a semiconductor device includes forming a trench in a dielectric layer of the semiconductor device and depositing a first conducting material within the trench to form a continuous liner layer within the trench. The liner layer is formed at a first temperature. The method also includes filling a remaining portion of the trench over the liner layer with a second conducting material at a second temperature. The second temperature is greater than the first temperature.

According to another embodiment of the present invention, a method for fabricating a multi-level interconnect in a semiconductor device includes forming a first trench in a first dielectric layer of the semiconductor device and forming a via extending from the first trench to a second trench disposed in a second dielectric layer of the semiconductor device. The second trench comprises a metal conductor, and a dielectric barrier is disposed between the first and second dielectric layers. The method also includes depositing a first conducting material within the first trench and the via to form a continuous liner layer within the first trench and the via. The liner layer is formed at a first temperature. The method further includes filling a remaining portion of the first trench and the via over the liner layer with a second conducting material to form the multi-level interconnect between the first trench and the second trench. The remaining portion of the first trench and the via are filled at a second temperature which is greater than the first temperature.

An important technical advantage of the present invention is that the continuous liner layer within the trench increases the mobility of the conducting material as the conducting material is deposited within the trench, thereby substantially eliminating premature contact of the conducting material from opposing sidewalls of the trench during filling of the trench and substantially preventing the formation of voids or other discontinuities within the conducting material.

Additionally, in one embodiment, the liner layer may be formed via chemical vapor deposition at a generally low temperature, for example, between 20–200 degrees Celsius, thereby substantially reducing the likelihood of agglomeration of the conducting material within the trench. A remaining portion of the trench may then be filled with the conducting material using a variety of techniques with the liner layer providing a wetting surface for the remaining filling process.

Other technical advantages of the present invention will be readily apparent to one skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1A:
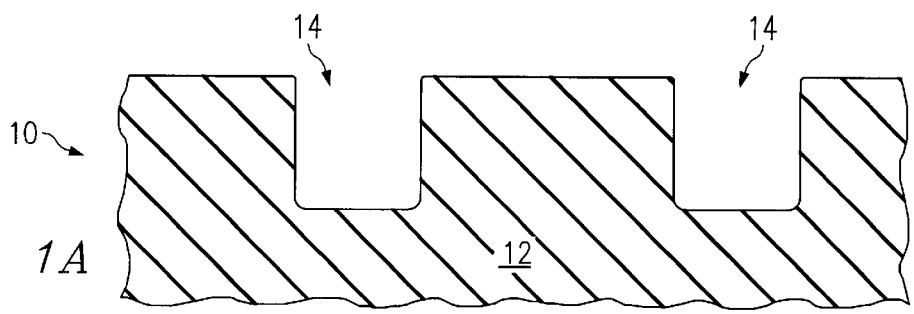
FIGS. 1A through 1E are a series of schematic cross-sectional diagrams illustrating the fabrication of a metal conductor in a semiconductor device in accordance with an embodiment of the present invention.

FIGS. 1A through 1E are sectional views illustrating a method of forming a metal conductor in a semiconductor device 10 in accordance with an embodiment of the present invention. Referring to FIG. 1A, device 10 includes a dielectric layer 12 having a plurality of channels or trenches 14 formed therein. Dielectric layer 12 may be formed of any suitable dielectric material having a generally low dielectric constant, such as silicon dioxide ($SiO_2$), plasma-enhanced tetraethyl orthosilicate (PETEOS), borophosphosilicate glass (BPSG), or low-K spin-on glass (SOG), and polymers and low-k materials deposited by CVD. Trenches 14 may be formed in dielectric layer 12 using conventional pattern etching techniques or other suitable methods.

Figure 1B:
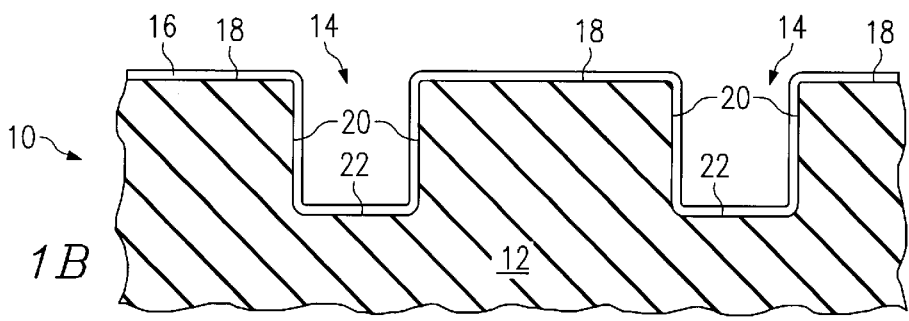

Referring to FIG. 1B, a diffusion barrier 16 may formed over dielectric layer 12 to substantially prevent migration of a conducting material into other materials of device 10. For example, copper, copper alloys, and other types of conducting materials diffuse very rapidly into other materials. Diffusion barrier 16 may be formed from tantalum nitride, titanium nitride, or any other suitable materials that effectively prevent the diffusion of one material into another. Diffusion barrier 16 generally includes a thickness in the range of approximately 10–500 angstroms; however, diffusion barrier 16 may have other suitable thicknesses for effectively preventing the diffusion of atoms from one material into another. As illustrated in FIG. 1B, diffusion barrier 16 is formed over upwardly facing surfaces 18 of dielectric layer 12, sidewalls 20 of trenches 14, and bottom walls 22 of trenches 14.

Figure 1C:
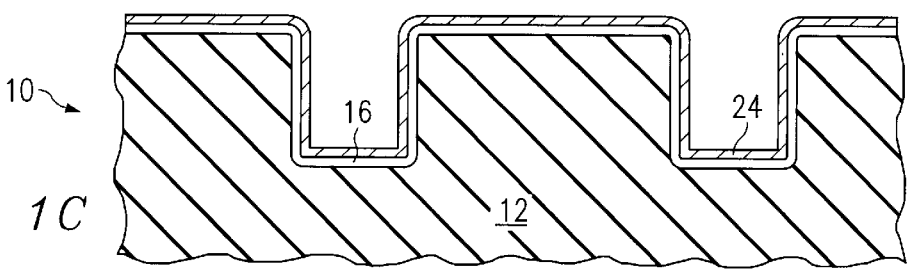

Referring to FIG. 1C, a conductor liner layer 24 is formed over diffusion barrier 16. Conductor liner layer 24 is generally formed using chemical vapor deposition techniques to form a substantially continuous layer having a substantially uniform thickness over diffusion barrier 16 and within trenches 14. Alternatively, layer 24 can also be formed by electroplating or electroless plating such that layer 24 is deposited generally conformally at low temperatures. Conductor liner layer 24 may be formed from any one of a variety of conducting metals or metal alloys, such as copper (Cu), aluminum (Al), tungsten (W), and titanium nitride (TiN). Conductor liner layer 24 is generally formed over diffusion barrier 16 at a temperature of approximately 20–200 degrees Celsius.

Figure 1D:
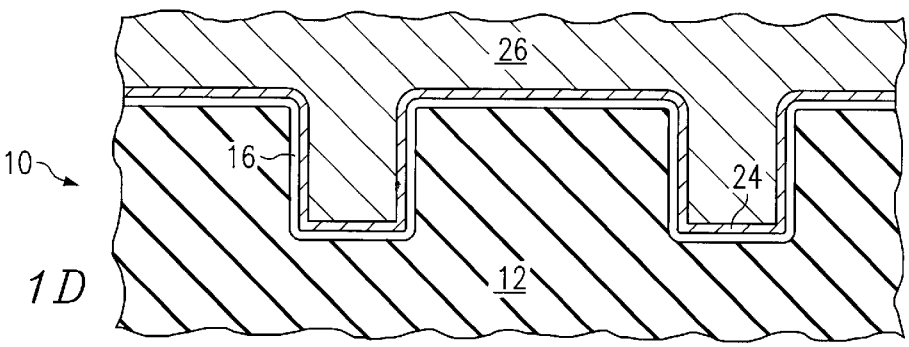

Referring to FIG. 1D, metal conductor 26 is formed over conductor liner layer 24 and within trenches 14. Metal conductor 26 may be formed using the conducting material used to form conductor liner layer 24; however, metal conductor 26 may also be formed using a conducting material different than the conducting material used to form conductor liner layer 24. For example, conductor liner layer 24 is generally formed using a conducting material to facilitate fast diffusion of the material used to form metal conductor 26 to enhance the mobility of the conducting material used to form metal conductor 26 into trenches 14. The conducting materials used to form metal conductor 26 and conductor liner layer 24 may be selected such that the selected materials share the same majority constituent. For example, a material comprising 98% copper and 2% carbon may be selected to form conductor liner layer 24, and a material comprising 99% copper and 1% magnesium may be selected to form the metal conductor 26. However, other combinations of conducting materials may also be used to form conductor liner layer 24 and metal conductor 26.

Figure 1E:
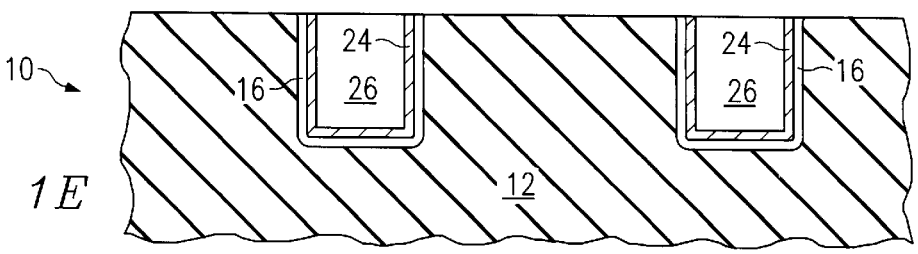

Metal conductor 26 may be formed using conventional semiconductor fabrication techniques, such as physical vapor deposition, or other suitable methods. Metal conductor 26 is generally formed at a temperature of approximately 200–400 degrees Celsius with physical vapor deposition (PVD) with enhanced directionality of flux. The enhanced directionality substantially prevents premature closure of the opening of trenches or vias before they are completely filled. The directionality can be improved by lowering chamber pressure, using a collimator or ionized sputtering, or increasing the distance between wafers and sputtering targets. Referring to FIG. 1E, excess conducting material used to form metal conductor 26 may be removed from upper surfaces of semiconductor device 10 using conventional semiconductor fabrication techniques, such as chemical mechanical polishing.

In accordance with the present invention, conductor liner layer 24 is formed within trenches 14 to enhance the filling of trenches 14 of metal conductor 26 while substantially preventing voids or other discontinuities within metal conductor 26. For example, forming conductor liner layer 24 via chemical vapor deposition at a generally low temperature substantially prevents premature contact of the conducting material from opposing sidewalls of trenches 14 during filling of trenches 14 which otherwise may result in voids or discontinuities within metal conductor 26. Additionally, conductor liner layer 24 is formed having a continuous and generally uniform thickness, thereby substantially preventing an increase to the aspect ratio of trenches 14. Further, forming conductor liner layer 24 in accordance with the present invention substantially eliminates agglomeration of the conducting material along sidewalls 20 and bottom wall 22 of trenches 14. Therefore, the present invention provides a method for filling cavities within a semiconductor device that substantially decreases the likelihood of voids or discontinuities within the formed cavities.

Additionally, the present invention provides greater electro-migration reliability than prior semiconductor device fabrication techniques. For example, one prior method for forming metal conductor 26 includes completely filling trenches 14 with a conducting material via chemical vapor deposition. However, chemical vapor deposition generally produces smaller grains, thereby reducing the electro-migration reliability of metal conductor 26. Thus, by forming metal conductor 26 using physical vapor deposition or other suitable techniques after formation of conductor liner layer 24 via chemical vapor deposition, eletro-migration reliability of metal conductor 26 is substantially increased.

Figure 2A:
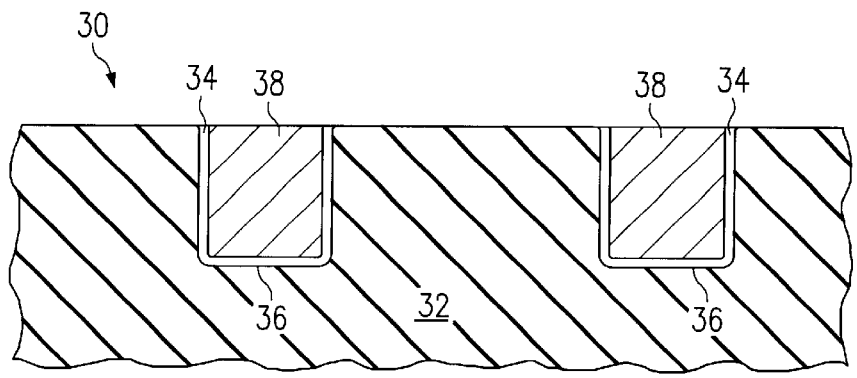
FIGS. 2A through 2F are a series of schematic cross-sectional diagrams illustrating the fabrication of a multi-level interconnect in a semiconductor device in accordance with another embodiment of the present invention.

FIGS. 2A through 2F are sectional views illustrating another method for fabricating a multi-level interconnect in a semiconductor device 30 in accordance with an embodiment of the present invention. Referring to FIG. 2A, device 30 includes a dielectric layer 32, diffusion barriers 34 formed within a plurality of trenches 36, and metal conductors 38 formed within trenches 36. Trenches 36, diffusion barriers 34, and metal conductors 38 may be formed as described above in connection with FIGS. 1A through 1E, including the formation of a conductor liner layer after formation of diffusion barriers 34 and prior to filling the remaining portions of trenches 36 with metal conductors 38.

Figure 2B:
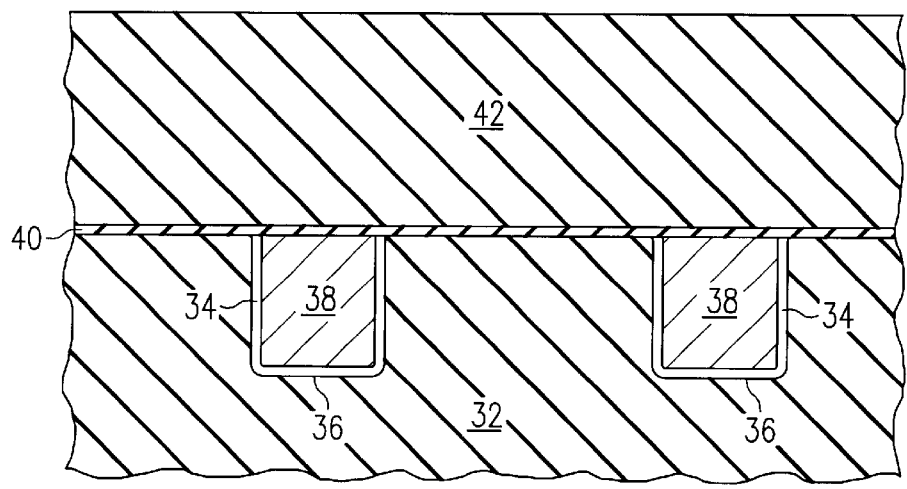

Referring to FIG. 2B, a dielectric barrier 40 is formed over dielectric layer 32 and metal conductors 38. Dielectric barrier 40 may be formed using conventional semiconductor device fabrication techniques, such as chemical vapor deposition. However, other suitable deposition techniques may also be used to form dielectric barrier 40. Dielectric barrier 40 may include silicon nitride or other suitable materials to form a barrier between adjacent dielectric layers. A dielectric layer 42 is formed over dielectric barrier 40 to form a multi-level semiconductor device 30. As described above in connection with FIGS. 1A through 1E, dielectric layer 42 may be formed using any one of a variety of processes, such as, for example, radio frequency sputtering, chemical vapor deposition, or spin-on glass process.

Figure 2C:
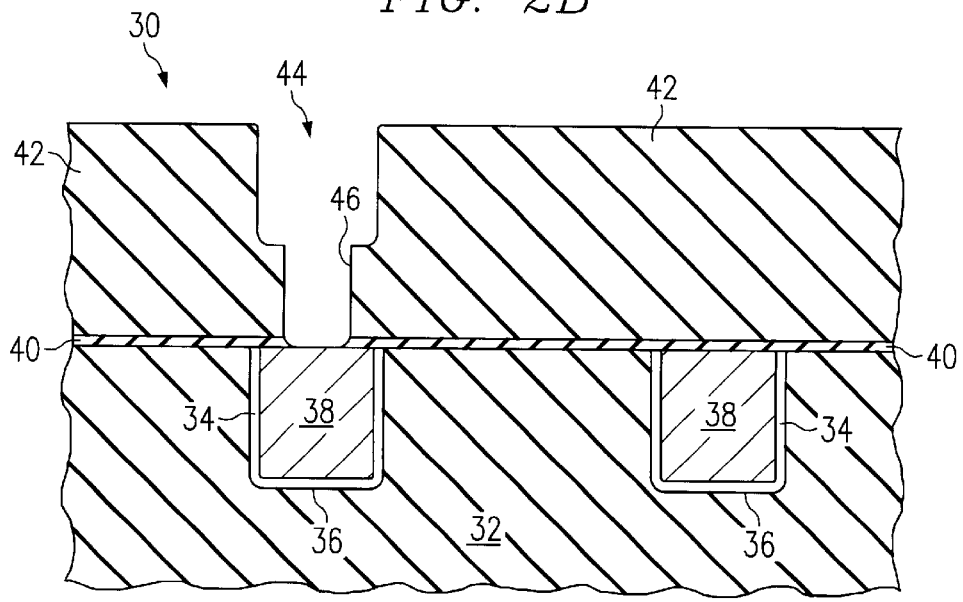

Referring to FIG. 2C, a trench 44 is formed in dielectric layer 42. Trench 44 may be formed using conventional semiconductor device fabrication techniques, such as pattern and etching techniques. A via 46 is formed extending from trench 44 to metal conductor 26 to provide a multi-level interconnect between metal conductor 26 and a corresponding metal conductor formed in trench 44, as will be described in greater detail below. Via 46 may be formed using conventional semiconductor device fabrication techniques, such as pattern etching techniques. However, other suitable methods may be used to form via 46. Additionally, it should be understood that the sequence or order of formation of the trench 44 and the via 46 may be varied without departing from the scope of the present invention.

Figure 2D:
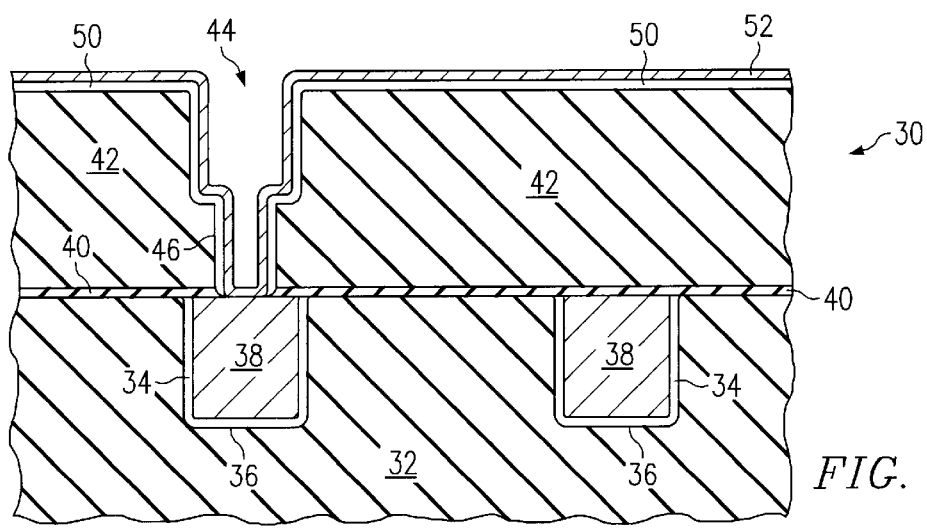

Referring to FIG. 2D, in this embodiment, a diffusion barrier 50 is formed over dielectric layer 42 and within trench 44 and via 46. Diffusion barrier 50 may be formed similarly to diffusion barrier 16 as described in connection with FIGS. 1A through 1E. After formation of diffusion barrier 50, a conductor liner layer 52 is formed over diffusion barrier 50 and within trench 44 and via 46. As described above in connection with FIGS. 1A through 1E, conductor liner layer 52 is formed by chemical vapor deposition, electroplating or electroless plating techniques at a temperature of approximately 20–200 degrees Celsius to form a continuous and substantially uniform layer of conducting material within trench 44 and via 46.

Figure 2E:
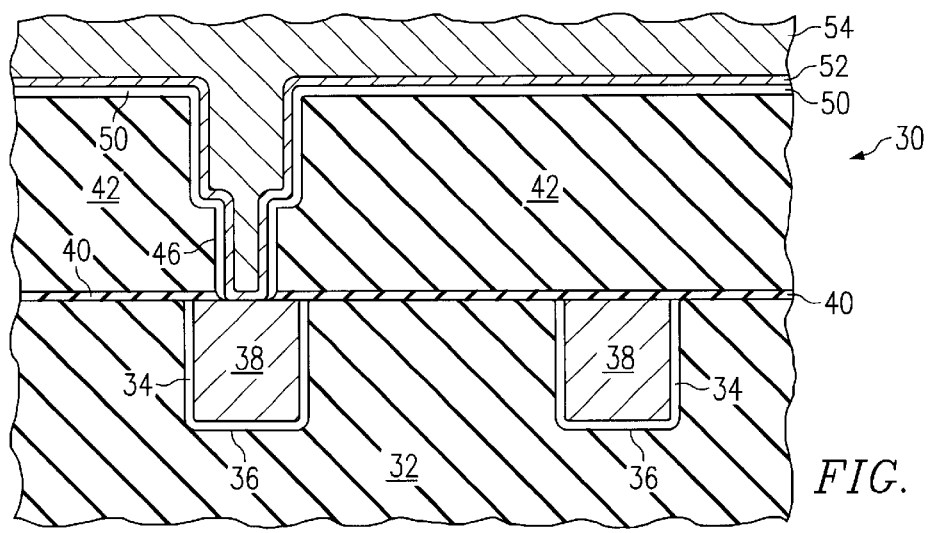
Figure 2F:
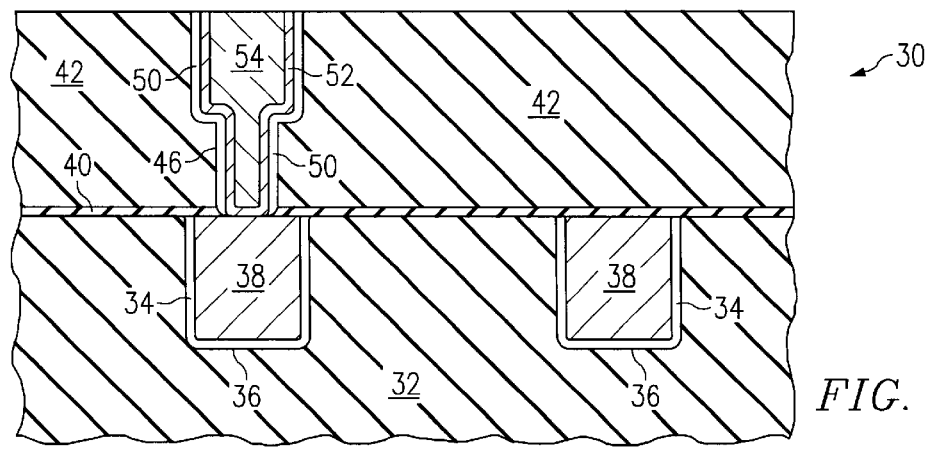

Referring to FIG. 2E, a metal conductor 54 is formed over conductor liner layer 52 and within trench 44 and via 46. As described above in connection with FIGS. 1A through 1E, metal conductor 54 is formed using a conducting material similar to or the same as the conducting material used to form conductor liner layer 52 such that conductor liner layer 52 provides enhanced mobility of the conducting material used to form metal conductor 54, thereby substantially eliminating the likelihood of voids or other discontinuities within trench 44 and via 46. Referring to FIG. 2F, excess conducting material used to form metal conductor 54 may be removed from upwardly facing surfaces of dielectric layer 42 using conventional semiconductor device fabrication techniques, such as chemical mechanical polishing techniques.

Therefore, the present invention provides a method for forming metal conductors and multi-level interconnects in semiconductor devices that substantially improves the integrity of the metal conductors and multi-level interconnects. For example, the present invention substantially eliminates voids or other discontinuities within the metal conductors and multi-level interconnects. Additionally, the present invention increases the electro-migration reliability of metal conductors formed in the semiconductor device.

Although the present invention and its advantages have been described in detail, it should be understood that various changes, substitutions, and alterations can be made therein without departing from the spirit and scope of the invention as defined by the appended claims.

What is claimed is:

1. A method for fabricating a metal conductor in a semiconductor device, comprising:

forming a trench in a dielectric layer of the semiconductor device;

depositing a first conducting material within the trench to form a continuous liner layer within the trench, the liner layer formed at a temperature equal to or less than 200 degrees Celsius using chemical vapor deposition; and filling a remaining portion of the trench over the liner layer with a second conducting material using physical vapor deposition at a second temperature, the second temperature greater than the first temperature.

2. The method of claim 1, further comprising forming a diffusion barrier within the trench prior to forming the liner layer.

3. The method of claim 1, wherein the first and second conducting materials comprise copper.

4. The method of claim 1, wherein filling a remaining portion of the trench comprises filling a remaining portion of the trench with the second conducting material at a temperature between 200–400 degrees Celsius.

5. The method of claim 1, wherein forming the continuous liner layer comprises forming the continuous liner layer having a thickness of between 50–2000 Angstroms.

6. A method for fabricating a metal conductor in a semiconductor device, comprising:

forming a trench in a dielectric layer of the semiconductor device;

forming a diffusion barrier within the trench;

depositing a first conducting material within the trench over the diffusion barrier using chemical vapor deposition at a temperature equal to or less than 200 degrees Celsius using chemical vapor deposition to form a continuous conductor liner layer within the trench over the diffusion barrier; and filling a remaining portion of the trench over the liner layer with a second conducting material using physical vapor deposition at a second temperature, the second temperature greater than the first temperature.

7. The method of claim 6, wherein depositing the first conducting material to form the liner layer comprises depositing the first conducting material to form the liner layer having a thickness of between 50–2000 Angstroms.

8. The method of claim 6, wherein the first and second conducting materials comprise copper.

9. The method of claim 6, wherein filling the remaining portion of the trench comprises filling the remaining portion of the trench with the second conducting material at a temperature between 200–400 degrees Celsius.

10. A method for fabricating a multi-level interconnect in a semiconductor device, comprising:

forming a first trench in a first dielectric layer of the semiconductor device;

forming a via extending from the first trench to a second trench disposed in a second dielectric layer of the semiconductor device, the second trench comprising a metal conductor, and wherein a dielectric barrier is disposed between the first and second dielectric layers;

depositing a first conducting material within the first trench and the via to form a continuous liner layer within the first trench and the via, the liner layer formed at a first temperature equal to or less than 200 degrees Celsius using chemical vapor deposition; and filling a remaining portion of the first trench and the via over the liner layer with a second conducting material at a second temperature to form the multi-level interconnect between the first trench and the second trench, the second temperature greater than the first temperature.

11. The method of claim 10, wherein depositing the first conducting material to form the liner layer comprises depositing the first conducting material to form the liner layer having a thickness of between 50–2000 Angstroms.

12. The method of claim 10, wherein forming the liner layer at a first temperature comprises forming the liner layer at a temperature equal to or less than 200 degrees Celsius.

13. The method of claim 10, wherein the first and second conducting materials comprise copper.

14. The method of claim 10, further comprising forming a diffusion barrier within the first trench and the via prior to forming the liner layer.

15. The method of claim 10, wherein the first and second conducting materials each comprise copper as a major constituent material.

* * * * *